US011646574B2

(12) United States Patent
Hu et al.

(10) Patent No.: US 11,646,574 B2
(45) Date of Patent: May 9, 2023

(54) DRIVING CIRCUIT, ARRAY SUBSTRATE AND DISPLAY APPARATUS

(71) Applicants: Fuzhou BOE Optoelectronics Technology Co., Ltd., Fujian (CN); BOE TECHNOLOGY GROUP CO., LTD., Beijing (CN)

(72) Inventors: Longgan Hu, Beijing (CN); Shanshan Yang, Beijing (CN); Wenchao Wang, Beijing (CN); Xiaolong Chen, Beijing (CN)

(73) Assignees: Fuzhou BOE Optoelectronics Technology Co., Ltd., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/555,455

(22) Filed: Dec. 19, 2021

(65) Prior Publication Data

US 2022/0320855 A1 Oct. 6, 2022

(30) Foreign Application Priority Data

Mar. 31, 2021 (CN) .......................... 202110346869.1

(51) Int. Cl.
*H02H 9/00* (2006.01)
*H05K 9/00* (2006.01)
*H02H 9/04* (2006.01)

(52) U.S. Cl.
CPC ........... *H02H 9/005* (2013.01); *H05K 9/0079* (2013.01); *G09G 2300/0408* (2013.01); *H02H 9/043* (2013.01); *H05K 9/0066* (2013.01); *H05K 9/0067* (2013.01)

(58) Field of Classification Search
CPC ........ H02H 9/005; H02H 9/043; H02H 9/041; H02H 9/046; G09G 2300/0408; G09G 2300/0439; G09G 2300/0434; G09G 2310/0267; G09G 2310/027; G09G 2310/0275; H05K 9/0079; H05K 9/0066; H05K 9/0067
USPC .................................................. 361/56, 91.1
See application file for complete search history.

(56) References Cited

U.S. PATENT DOCUMENTS

2016/0019826 A1* 1/2016 Kim .................... G09G 3/20
345/214
2017/0139292 A1* 5/2017 Yu ...................... G09G 3/3648

* cited by examiner

*Primary Examiner* — Danny Nguyen
(74) *Attorney, Agent, or Firm* — Houtteman Law LLC

(57) ABSTRACT

A driving circuit includes at least one first module, an electrostatic charge/discharge module connected to the first module and a grounding module; each first module includes a driving module, a signal transmission module and a gating module; the signal transmission module is connected to and transmits a driving signal to the driving module; the grounding module is grounded; the gating module is connected with the signal transmission module; the gating module is turned on with its turn-on voltage less than or equal to a voltage of the signal transmission module, or turned off with the turn-on voltage greater than the voltage of the signal transmission module; the turn-on voltage of the gating module is greater than that of the driving module; the charge/discharge module is connected to the gating module and the grounding module, and configured to store charges flowing therethrough and release the charges to the grounding module.

20 Claims, 6 Drawing Sheets

DRIVING CIRCUIT, ARRAY SUBSTRATE AND DISPLAY APPARATUS

CROSS REFERENCE TO RELATED APPLICATIONS

The present application claims the priority of the Chinese Patent Application No. 202110346869.1 filed on Mar. 31, 2021, the content of which is incorporated herein by reference in its entirety.

TECHNICAL FIELD

The present disclosure relates to the field of display technology, and in particular to a driving circuit, an array substrate and a display apparatus.

BACKGROUND

In the manufacturing process of a display panel, the display panel usually contacts with other devices, such that a friction occurs therebetween, and thus, electrostatic charges are accumulated in a region with a high metal line density (for example, a Gate Driver on Array (GOA) circuit) on the display panel.

SUMMARY

The present disclosure provides a driving circuit, an array substrate and a display apparatus.

In a first aspect of the present disclosure, the present disclosure provides a driving circuit including at least one first module, an electrostatic charge and discharge module and a grounding module, wherein the at least one first module is electrically connected to the electrostatic charge and discharge module; each first module of the at least one first module includes a driving module, a signal transmission module and a unidirectional gating module; the signal transmission module is electrically connected to the driving module and is configured to transmit a driving signal to the driving module; the grounding module is configured to be grounded; the unidirectional gating module is connected with the signal transmission module in series; the unidirectional gating module is configured to be turned on when a turn-on voltage of the unidirectional gating module is less than or equal to a voltage output by the signal transmission module, or turned off when the turn-on voltage of the unidirectional gating module is greater than the voltage output by the signal transmission module; the turn-on voltage of the unidirectional gating module is greater than that of the driving module; the electrostatic charge and discharge module is connected with the unidirectional gating module in each first module of the at least one first module in series and is electrically connected to the grounding module, and the electrostatic charge and discharge module is configured to store charges flowing through the electrostatic charge and discharge module and release the stored charges to the grounding module.

In some embodiments of the present disclosure, the unidirectional gating module includes a diode element, an input electrode of the diode element is electrically connected to an output terminal of the corresponding signal transmission module, and an output electrode of the diode element is electrically connected to an input terminal of the electrostatic charge and discharge module.

In some embodiments of the present disclosure, the diode element includes a thin film transistor, one of a source electrode and a drain electrode of the thin film transistor functions as the output electrode and the other of the source electrode and the drain electrode is electrically connected to a gate electrode and functions as the input electrode.

In some embodiments of the present disclosure, the thin film transistor includes an amorphous silicon thin film transistor or an oxide thin film transistor.

In some embodiments of the present disclosure, the source electrode and the gate electrode are in different layers; the source electrode and the drain electrode are in a same layer; the grounding module and the gate electrode are in a same layer.

In some embodiments of the present disclosure, the source electrode and the gate electrode are electrically connected to each other.

In some embodiments of the present disclosure, the electrostatic charge and discharge module includes a capacitive element, a first electrode of the capacitive element is electrically connected to the unidirectional gating module, and a second electrode of the capacitive element is electrically connected to the grounding module.

In some embodiments of the present disclosure, the capacitive element includes a first conductive layer, an insulating layer, and a second conductive layer, the insulating layer is on the first conductive layer, the second conductive layer is on the insulating layer, one of the first conductive layer and the second conductive layer functions as the first electrode, and the other of the first conductive layer and the second conductive layer functions as the second electrode.

In some embodiments of the present disclosure, the first conductive layer is a source-drain metal film layer, the insulating layer is a silicon nitride film layer, and the second conductive layer is an indium tin oxide film layer.

In some embodiments of the present disclosure, the electrostatic charge and discharge module further includes a resistive element, one terminal of the resistive element is electrically connected to the capacitive element and the other terminal of the resistive element is electrically connected to the grounding module, the resistive element is configured to transmit charges released from the capacitive element to the grounding module.

In some embodiments of the present disclosure, the resistive element includes an indium tin oxide film layer.

In some embodiments of the present disclosure, the at least one first module includes a plurality of first modules; in each of the plurality of first modules, the signal transmission module is electrically connected to the corresponding driving module; the signal transmission module is configured to transmit a driving signal to the corresponding driving module; the unidirectional gating module is connected with the corresponding signal transmission module in series and connected with the electrostatic charge and discharge module in series; the unidirectional gating module is configured to be turned on when the turn-on voltage of the unidirectional gating module is less than or equal to the voltage output by the corresponding signal transmission module or turned off when the turn-on voltage of the unidirectional gating module is greater than the voltage output by the corresponding signal transmission module; and the turn-on voltage of the unidirectional gating module is greater than the turn-on voltage of the corresponding driving module.

In some embodiments of the present disclosure, the driving circuit includes a gate driver on array circuit, which includes a plurality of cascaded shift registers, the driving module includes a first stage shift register of the plurality of cascaded shift registers, and the signal transmission module includes a start vertical input signal line electrically connected to an input terminal of the first stage shift register and configured to transmit a start driving signal to the first stage shift register.

In a second aspect of the present disclosure, the present disclosure provides an array substrate including a driving circuit, wherein the driving circuit includes at least one first module, an electrostatic charge and discharge module and a grounding module, wherein the at least one first module is electrically connected to the electrostatic charge and discharge module; each first module of the at least one first module includes a driving module, a signal transmission module and a unidirectional gating module; the signal transmission module is electrically connected to the driving module and is configured to transmit a driving signal to the driving module; the grounding module is configured to be grounded; the unidirectional gating module is connected with the signal transmission module in series; the unidirectional gating module is configured to be turned on when a turn-on voltage of the unidirectional gating module is less than or equal to a voltage output by the signal transmission module, or turned off when the turn-on voltage of the unidirectional gating module is greater than the voltage output by the signal transmission module; the turn-on voltage of the unidirectional gating module is greater than that of the driving module; the electrostatic charge and discharge module is connected with the unidirectional gating module in each first module of the at least one first module in series and is electrically connected to the grounding module, and the electrostatic charge and discharge module is configured to store charges flowing through the electrostatic charge and discharge module and release the stored charges to the grounding module.

In some embodiments of the present disclosure, the electrostatic charge and discharge module includes a capacitive element, a first electrode of the capacitive element is electrically connected to the unidirectional gating module, and a second electrode of the capacitive element is electrically connected to the grounding module, wherein the capacitive element includes a first conductive layer, an insulating layer, and a second conductive layer, the insulating layer is on the first conductive layer, the second conductive layer is on the insulating layer, one of the first conductive layer and the second conductive layer functions as the first electrode, and the other of the first conductive layer and the second conductive layer functions as the second electrode, wherein the first conductive layer is a source-drain metal film layer, the insulating layer is a silicon nitride film layer, and the second conductive layer is an indium tin oxide film layer.

In some embodiments of the present disclosure, the at least one first module includes a plurality of first modules; in each of the plurality of first modules, the signal transmission module is electrically connected to the corresponding driving module; the signal transmission module is configured to transmit a driving signal to the corresponding driving module; the unidirectional gating module is connected with the corresponding signal transmission module in series and connected with the electrostatic charge and discharge module in series; the unidirectional gating module is configured to be turned on when the turn-on voltage of the unidirectional gating module is less than or equal to the voltage output by the corresponding signal transmission module or turned off when the turn-on voltage of the unidirectional gating module is greater than the voltage output by the corresponding signal transmission module; and the turn-on voltage of the unidirectional gating module is greater than the turn-on voltage of the corresponding driving module.

In some embodiments of the present disclosure, the driving circuit includes a gate driver on array circuit, the gate driver on array circuit includes a plurality of cascaded shift registers, the driving module includes a first stage shift register of the plurality of cascaded shift registers, and the signal transmission module includes a start vertical input signal line electrically connected to an input terminal of the first stage shift register and configured to transmit a start driving signal to the first stage shift register.

In a third aspect of the present disclosure, the present disclosure provides a display apparatus, including an array substrate and a color filter substrate aligned and assembled together, wherein the array substrate is the above array substrate.

In some embodiments of the present disclosure, the at least one first module includes a plurality of first modules; in each of the plurality of first modules, the signal transmission module is electrically connected to the corresponding driving module; the signal transmission module is configured to transmit a driving signal to the corresponding driving module; the unidirectional gating module is connected with the corresponding signal transmission module in series and connected with the electrostatic charge and discharge module in series; the unidirectional gating module is configured to be turned on when the turn-on voltage of the unidirectional gating module is less than or equal to the voltage output by the corresponding signal transmission module or turned off when the turn-on voltage of the unidirectional gating module is greater than the voltage output by the corresponding signal transmission module; and the turn-on voltage of the unidirectional gating module is greater than the turn-on voltage of the corresponding driving module.

In some embodiments of the present disclosure, the driving circuit includes a gate driver on array circuit, the gate driver on array circuit includes a plurality of cascaded shift registers, the driving module includes a first stage shift register of the plurality of cascaded shift registers, and the signal transmission module includes a start vertical input signal line electrically connected to an input terminal of the first stage shift register and configured to transmit a start driving signal to the first stage shift register.

Figure 1A:
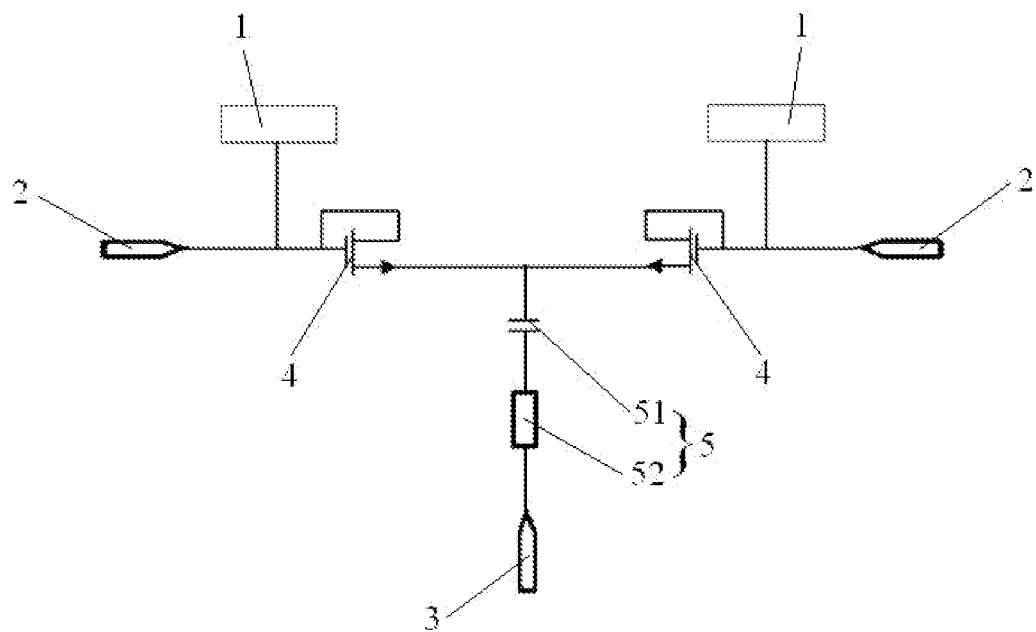
FIG. 1A is a schematic diagram of a structure of a driving circuit provided in an embodiment of the present disclosure.

DESCRIPTION OF REFERENCE NUMERALS 1. driving module; 2. signal transmission module; 3. grounding module; 4. unidirectional gating module; 5. electrostatic charge and discharge module; 51. capacitive element; 511. first conductive layer; 512. insulating layer; 513. second conductive layer; 52. resistive element; 521. source electrode; 522. drain electrode; 523. gate electrode; 524. semiconductor layer; 525. first through via; 526. second through via; 6. electrostatic discharge module; 71. base substrate; 72. gate insulating layer.

DETAIL DESCRIPTION OF EMBODIMENTS

In order to make one of ordinary skill in the art better understand the technical solutions of the present disclosure, a driving circuit, an array substrate and a display apparatus provided in the present disclosure are described in detail below with reference to the accompanying drawings.

In the manufacturing process of a display panel, the display panel usually contacts with other devices, such that a friction occurs therebetween, and thus, electrostatic charges are accumulated in a region with a high metal line density (for example, a Gate Driver on Array (GOA) circuit) on the display panel. In addition, there are few interfaces between start vertical input (for short, STV In) signal lines of the GOA circuit and GOA units of the GOA circuit, such that electrostatic charges accumulated on the STV In signal lines may only be led out to the GOA units only through the few interfaces between the STV In signal lines and the GOA units, which may cause first few rows of circuits In the GOA circuit to be broken down and burned out, resulting in a poor display of the display panel. A conventional GOA circuit includes an electrostatic discharge (ESD) module, one end of which is connected to a start vertical input signal line, and the other end is grounded. However, in a previous phase of the manufacturing process of the display panel, the display panel is not connected to external circuits, and the electrostatic discharge module cannot sufficiently discharge electrostatic charges through the external circuits, so that the protection capability of the electrostatic discharge module is weak, and several rows of circuits in the GOA circuit are still broken down and burned out, thereby causing a poor display of the display panel.

In addition, electrostatic charges may also be introduced into the display panel through the ground (GND) signal line at the outermost periphery of the display panel from the outside, which may cause, for example, breakdown of the electrostatic discharge module and the driving circuit. In a conventional design, a chamfered corner is usually configured for the display panel to reduce a tip effect; and a sealant is used to cover grounding signal lines to reduce a probability of introducing electrostatic charges to the display panel from the outside. However, the sealant covers the grounding signal lines such that a portion of the frame is occupied, which is not favorable for the design of the ultra-narrow frame of a monitor (MNT). Moreover, this design also cannot completely avoid the problem of electrostatic charges being introduced to the display panel from the outside.

The present disclosure is directed to at least solve one of the technical problems in the related art, and provides a driving circuit, an array substrate and a display apparatus, which may prevent the driving circuit from being broken down and burned out by electrostatic charges, improve the stability of the display panel, and reduce a frame width of the display panel.

FIG. 1A is a schematic diagram of a structure of a driving circuit provided in an embodiment of the present disclosure. As shown in FIG. 1A, an embodiment of the present disclosure provides a driving circuit, which may include at least one first module, a grounding module 3, and an electrostatic charge and discharge module 5, wherein the at least one first module is electrically connected to the electrostatic charge and discharge module 5; each first module includes a driving module 1, a signal transmission module 2 and a unidirectional gating module 4; the signal transmission module 2 is electrically connected to the driving module 1 and configured to transmit a driving signal to the driving module 1; the grounding module 3 is configured to be grounded; the unidirectional gating module 4 is connected with the signal transmission module 2 in series; the unidirectional gating module 4 is configured to be turned on when a turn-on voltage of the unidirectional gating module 4 is less than or equal to a voltage output by the signal transmission module 2, or turned off when the turn-on voltage of the unidirectional gating module 4 is greater than the voltage output by the signal transmission module 2, and the turn-on voltage of the unidirectional gating module 4 is greater than a turn-on voltage of the driving module 1; the electrostatic charge and discharge module 5 is connected with each unidirectional gating module 4 in series and is electrically connected to the grounding module 3; the electrostatic charge and discharge module 5 is configured to store charges flowing therethrough and discharge the stored charges to the grounding module 3.

In the manufacturing process of the display panel, electrostatic charges, which are accumulated in the region with the high metal line density (for example, the signal transmission modules 2 as shown in FIG. 1A) on the display panel due to the contact friction between the display panel and other devices, are always maintained in the region with the high metal line density, until the display panel is normally operated. In other words, no process is performed to discharge electrostatic charges accumulated in the region with the high metal line density (e.g., the signal transmission modules 2 as shown in FIG. 1A) on the display panel, before the display panel is normally operated. At the beginning of the normal operation of the display panel, the large amount of electrostatic charges are accumulated at the signal transmission modules 2, such that the voltage output by the signal transmission module 2 is higher than the turn-on voltage of the unidirectional gating module 4, so that the unidirectional gating module 4 is turned on to conduct the large amount of electrostatic charges accumulated at the signal transmission module 2 to the electrostatic charge and discharge module 5 in a manner of instantaneous large current for storage, and then, the large amount of electrostatic charges are released (discharged) to the grounding module 3. Although the turn-on voltage of the unidirectional gating module 4 is greater than the turn-on voltage of the driving module 1 in the embodiment of the present disclosure, the large amount of electrostatic charges accumulated at the signal transmission module 2 are not conducted to the driving module 1, are only to turn on the unidirectional gating module 4, and then are conducted to the electrostatic charge and discharge module 5 for storage, and then discharged to the grounding module 3. In this way, the driving circuit may be prevented from being broken down and burned out by electrostatic charges, which are accumulated in the region with the high metal line density (for example, the signal transmission modules 2 as shown in FIG. 1A) on the display panel due to the contact friction between the display panel and other devices in the manufacturing process of the display panel, and the stability of the display panel is improved.

In the driving circuit provided in the embodiment of the present disclosure, the unidirectional gating module 4 is connected in series with the signal transmission module 2; the electrostatic charge and discharge module 5 is connected in series with the unidirectional gating module 4 and is connected to the ground; the unidirectional gating module 4 may be turned on when the turn-on voltage of the unidirectional gating module is less than or equal to the voltage output by the signal transmission module 2; and the electrostatic charge and discharge module 5 may store charges flowing through the electrostatic charge and discharge module 5 and discharge the stored charges to the grounding module 3. In this way, when the voltage of the signal transmission module 2 is greater than or equal to the turn-on voltage of the unidirectional gating module 4 due to the electrostatic charges accumulated in the manufacturing process of the display panel, the unidirectional gating module 4 is turned on, so that the signal transmission module 2 is electrically connected to the electrostatic charge and discharge module 5 through the unidirectional gating module 4, the electrostatic charges accumulated by the signal transmission module 2 may be led out to the electrostatic charge and discharge module 5 through the unidirectional gating module 4, and the electrostatic charge and discharge module 5 stores the electrostatic charges led out from the unidirectional gating module 4 and releases the electrostatic charges to the grounding module 3. In this way, the electrostatic charges may be prevented from being introduced to the driving module 1 electrically connected with the signal transmission module 2, and thus, the driving circuit is prevented from being broken down and burned out by electrostatic charges, and the stability of the display panel is improved. When external electrostatic charges are introduced to the driving circuit through the grounding module 3 when the display panel is normally operated, the external electrostatic charges introduced may be stored by the electrostatic charge and discharge module 5 and released to the grounding module 3, such that the grounding module 3 is not required to be covered by the sealant, the external electrostatic charges may be prevented from being introduced to the driving module 1 and further, the driving circuit may be prevented from being broken down and burned out by electrostatic charges, and the stability of the display panel is improved, and the frame width of the display panel may be reduced. In addition, in the driving circuit provided in the embodiment of the present disclosure, the unidirectional gating module 4 may be turned off when the turn-on voltage of the unidirectional gating module 4 is greater than the voltage of the signal transmission module 2, and the turn-on voltage of the unidirectional gating module 4 is greater than the turn-on voltage of the driving module 1. In this way, when the signal transmission module 2 transmits a normal driving signal to the driving module 1, the unidirectional gating module 4 is in an off state, so that the normal driving signal may be transmitted to the driving module 1, and the driving circuit may work normally.

In the embodiment of the present disclosure, the turn-on voltage of the unidirectional gating module 4 is an inherent property of the unidirectional gating module 4, and is a voltage that turns on the unidirectional gating module 4. When an input voltage of the unidirectional gating module 4 (as shown in FIG. 1A, the voltage output by the signal transmission module 2 is the input voltage of the unidirectional gating module 4) is greater than the turn-on voltage of the unidirectional gating module 4, the unidirectional gating module 4 is turned on. In the embodiment of the present disclosure, the turn-on voltage of the driving module 1 is an inherent property of the driving module 1, and is a voltage for turning on the driving module 1.

In an embodiment of the present disclosure, the driving circuit may include a gate driver on array; the gate driver on array circuit includes a plurality of cascaded shift registers; the driving module 1 may include a first stage shift register of a plurality of shift registers connected in cascade; the signal transmission module 2 may include a start vertical input signal line; the start vertical input signal line is electrically connected to an input terminal of the first stage shift register, and is configured to transmit a start driving signal to the first stage shift register. However, the types of the driving circuit, the driving module 1 and the signal transmission module 2 are not limited thereto.

The driving circuit provided in the embodiment of the present disclosure will be described below by taking an example in which the driving circuit is used as the gate driver on array circuit; the driving module 1 is used as the first stage shift register of the plurality of shift registers of the gate driver on array circuit; the signal transmission module 2 is used as the start vertical input signal line of the gate driver on array circuit; the grounding module 3 is used as a grounding signal line of the gate driver on array circuit.

In some embodiments of the present disclosure, the array substrate may be fabricated on a base substrate, such as glass. However, the present disclosure is not limited thereto. In other embodiments of the present disclosure, the array substrate may also be fabricated on the base substrate of other materials.

When the gate driver on array circuit works normally, the start vertical input signal line may transmit the start driving signal to the first stage shift register, and a voltage of the start driving signal reaches a turn-on voltage of the first stage shift register. Since the turn-on voltage of the unidirectional gating module 4 is greater than the turn-on voltage of the first stage shift register, the unidirectional gating module 4 is in an off state and cannot be turned on at this time. In this way, the situation is avoided that the first stage shift register cannot be turned on due to the following reasons: the unidirectional gating module 4 is turned on, so that charges of the start driving signal are led out to the electrostatic charge and discharge module 5 through the unidirectional gating module 4, and thus, the voltage of the start driving signal transmitted to the first stage shift register is smaller than the turn-on voltage of the first stage shift register. Therefore, the start driving signal may normally turn on the first stage shift register. Because the plurality of shift registers of the gate driver on array circuit are connected in cascade, the plurality of shift registers of the gate driver on array circuit may be sequentially turned on after the first stage shift register is turned on, so that the gate driver on array circuit may normally work.

Electrostatic charges are accumulated on the start vertical input signal line, such that the voltage of the start vertical input signal line increases. When the voltage of the start vertical input signal line is increased to be greater than or equal to the turn-on voltage of the unidirectional gating module 4, the unidirectional gating module 4 is turned on, which causes the start vertical input signal line to be electrically connected with the electrostatic charge and discharge module 5 through the unidirectional gating module 4, so that the electrostatic charges accumulated on the start vertical input signal line may be led out to the electrostatic charge and discharge module 5 through the unidirectional gating module 4. The electrostatic charges led out to the electrostatic charge and discharge module 5 are stored by the electrostatic charge and discharge module 5, then gradually released to the grounding signal line by the electrostatic charge and discharge module 5, and finally released through the grounding signal line. Therefore, on one hand, electrostatic charges may be prevented from being introduced to the first stage shift register electrically connected with the start vertical input signal line, so that the first several stages of shift registers of the gate driver on array circuit are prevented from being broken down and burned out by electrostatic charges, and the stability of the display panel is improved; on the other hand, it is also possible to prevent the charges of the normal start driving signal from being led out to the electrostatic charge and discharge module 5 due to the too fast discharge of the electrostatic charges. Based on the above, the gate driver on array circuit may work normally.

When external electrostatic charges (for example, electrostatic charges generated by touch control) are introduced into the gate driver on array circuit through the grounding signal line, the external electrostatic charges are firstly introduced to the electrostatic charge and discharge module 5 through the grounding signal line, and the external electrostatic charges introduced to the electrostatic charge and discharge module 5 are stored by the electrostatic charge and discharge module 5. Since the unidirectional gating module 4 is not turned on at this time, the external electrostatic charges are gradually released to the grounding signal line by the electrostatic charge and discharge module 5, and finally released to the grounding signal line. Therefore, external electrostatic charges may be prevented from entering the circuit (such as the first stage shift register and the like) in the gate driver on array circuit, so that the gate driver on array circuit is prevented from being broken down and burned out by electrostatic charges, and the stability of the display panel is improved. In addition, the sealant is not needed to cover the grounding signal line, so that the gate driver on array circuit may be prevented from being broken down and burned out by electrostatic charges, and therefore, the adverse effect of the sealant on the design of the ultra-narrow frame may be avoided, and the frame width of the display panel may be reduced.

In an embodiment of the present disclosure, the driving circuit may include a plurality of first modules. Accordingly, the driving circuit includes a plurality of driving modules 1, a plurality of signal transmission modules 2, and a plurality of unidirectional gating modules 4, respectively. The plurality of signal transmission modules 2 are electrically connected to the plurality of driving modules 1 in a one-to-one correspondence; each signal transmission module 2 is configured to transmit a driving signal to the corresponding driving module 1; the plurality of unidirectional gating modules 4 are connected with the plurality of signal transmission modules 2 in a one-to-one correspondence in series and are connected to the electrostatic charge and discharge module 5 in series; each unidirectional gating module 4 is configured to be turned on when the turning-on voltage of the unidirectional gating module 4 is less than or equal to the voltage of the corresponding signal transmission module 2, or turned off when the turning-on voltage of the unidirectional gating module 4 is greater than the voltage of the corresponding signal transmission module 2, and the turning-on voltage of each unidirectional gating module 4 is greater than the turning-on voltage of the corresponding driving module 1.

In such the design, the electrostatic charges accumulated by the plurality of signal transmission modules 2 may be led out through only one electrostatic charge and discharge module 5, thereby reducing the complexity of the driving circuit and the manufacturing cost of the driving circuit. When one or more signal transmission modules 2 in the plurality of signal transmission modules 2 accumulate electrostatic charges such that the voltage of each of one or more signal transmission modules 2 is greater than or equal to the turn-on voltage of the corresponding unidirectional gating module 4, the corresponding unidirectional gating module 4 is turned on, so that the accumulated electrostatic charges may be led out to the electrostatic charge and discharge module 5, the accumulated electrostatic charges are prevented from being introduced to the corresponding driving module 1, and the corresponding driving module 1 is prevented from being broken down and burned out by electrostatic charges.

Figure 1B:
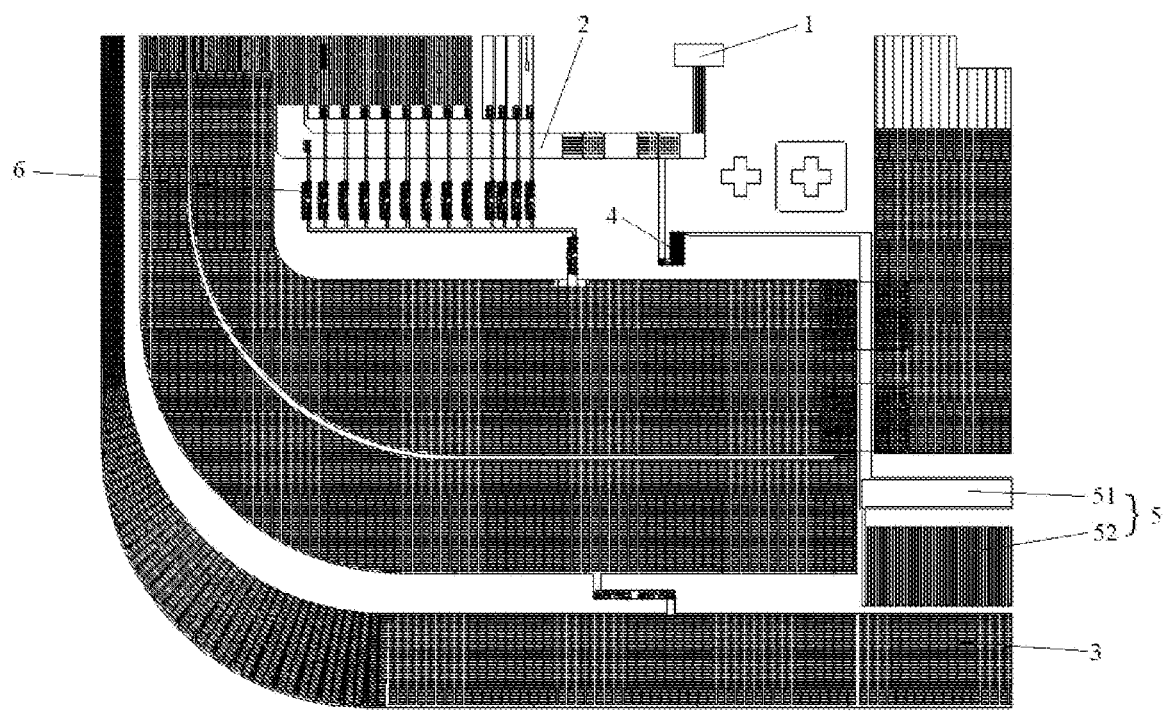
FIG. 1B is a schematic diagram of a part of a structure of a driving circuit arranged on a first side of a non-display region (for example, on a bottom left corner) of an array substrate provided in an embodiment of the present disclosure.
Figure 1C:
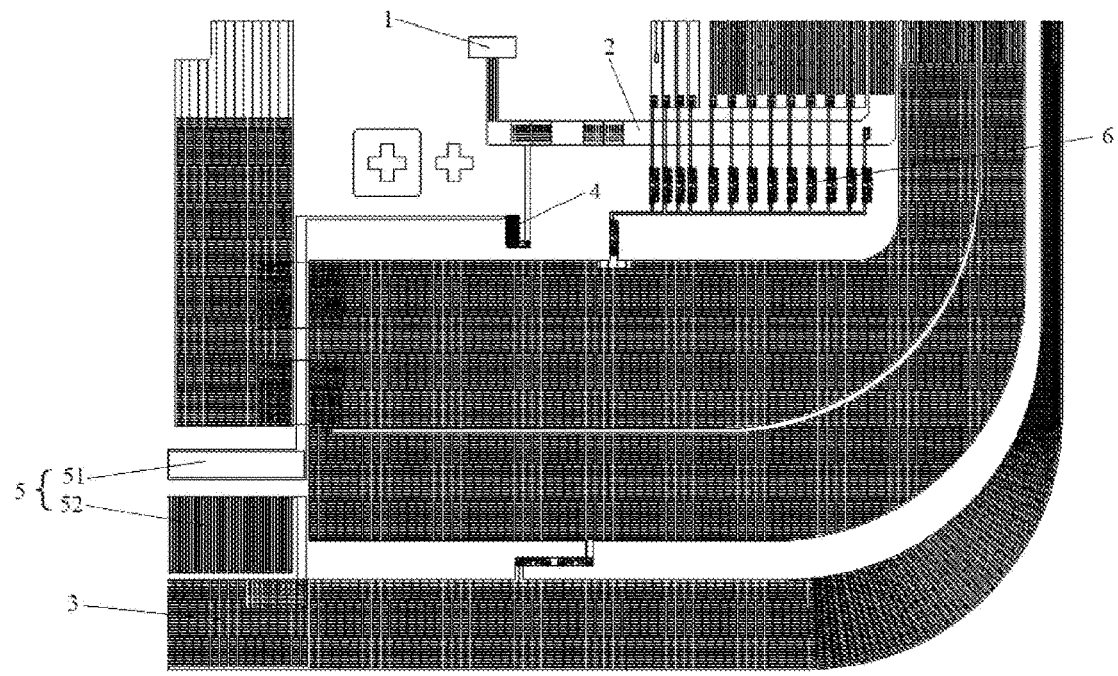
FIG. 1C is a schematic diagram of a part of a structure of a driving circuit arranged on a second side of a non-display region (for example, on a bottom right corner) of an array substrate provided in an embodiment of the present disclosure.

FIG. 1B is a schematic diagram illustrating a case in which a part of a structure of the driving circuit shown in FIG. 1A is arranged on a left side (for example, a bottom left corner) of a non-display region of an array substrate provided in an embodiment of the present disclosure; FIG. 1C is a schematic diagram illustrating a case in which a part of a structure of a driving circuit shown in FIG. 1A is arranged on a right side (for example, a bottom right corner) of a non-display region of an array substrate provided in an embodiment of the present disclosure. From FIGS. 1B and 1C, it can be seen that the electrostatic charge and discharge module 5 and the grounding module 3 may be provided in the middle of the non-display region of the array substrate, and the two first modules, each of which includes one driving module 1, one signal transmission module 2 and one unidirectional grating module 4, are provided at two sides of the electrostatic charge and discharge module 5 (as shown in FIGS. 1B to 1C, at the left and right sides of the electrostatic charge and discharge module 5, i.e., at the bottom left corner and the bottom right corner of the non-display region).

Figure 1D:
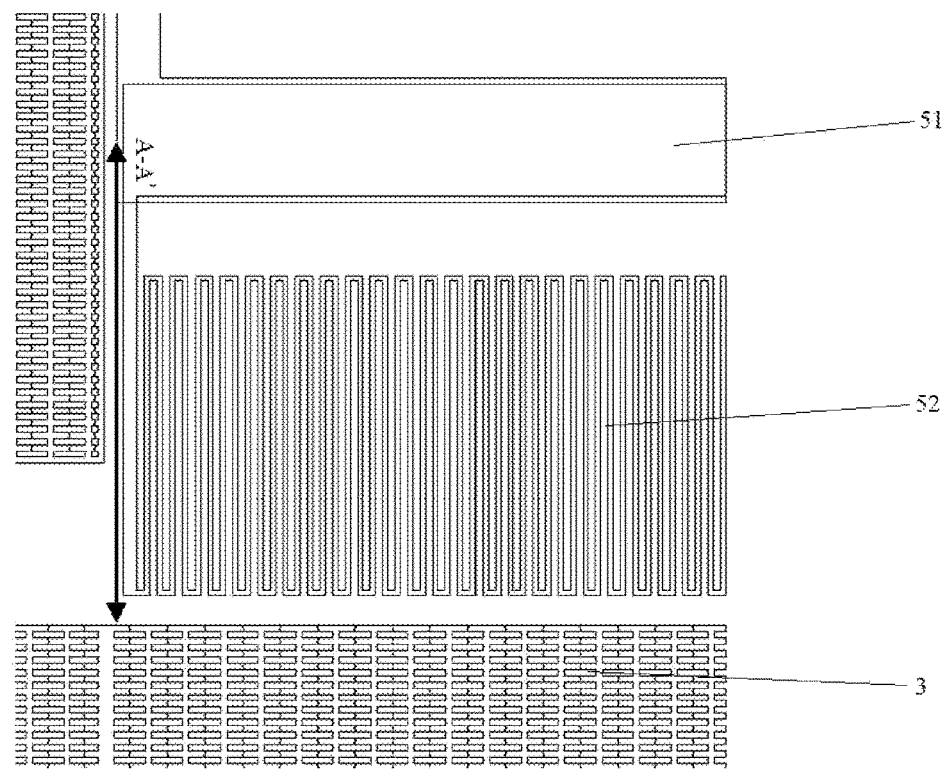
FIG. 1D is an enlarged schematic diagram of a structure of an electrostatic charge and discharge module and a grounding module in FIG. 1B.
Figure 1E:
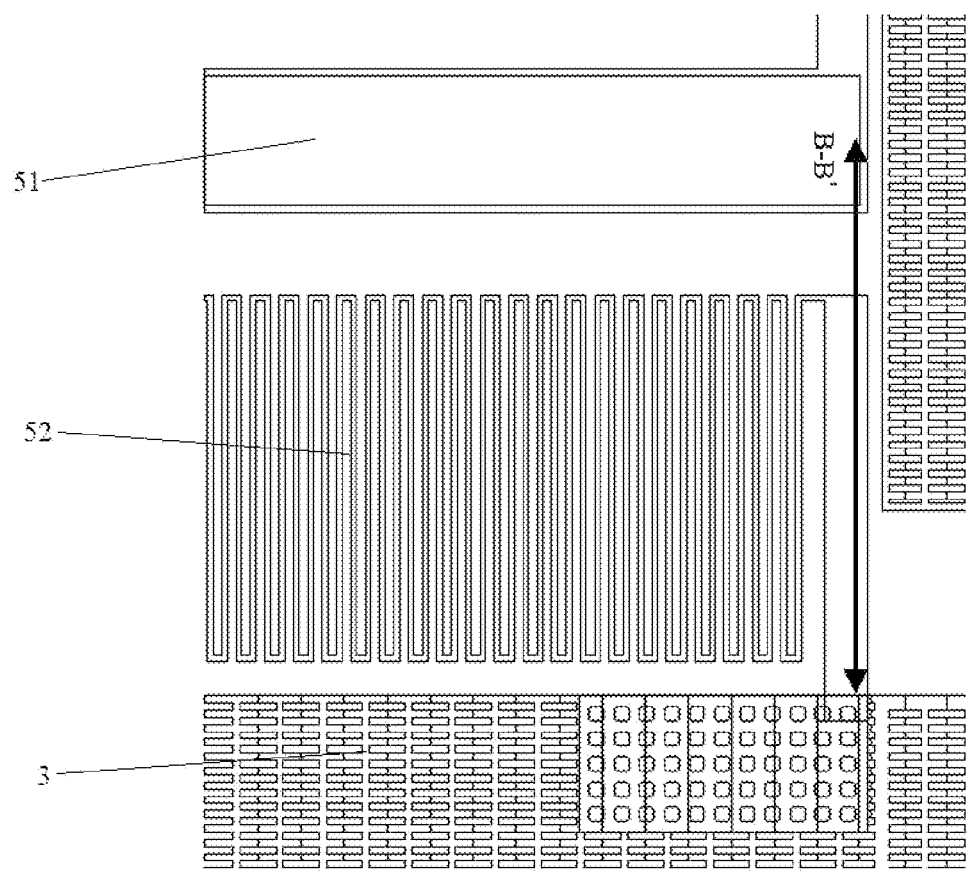
FIG. 1E is an enlarged schematic diagram of a structure of an electrostatic charge and discharge module and a grounding module in FIG. 1C.

FIG. 1D is an enlarged schematic diagram of a structure of an electrostatic charge and discharge module and a grounding module in FIG. 1B; FIG. 1E is an enlarged schematic diagram of a structure of an electrostatic charge and discharge module and a grounding module in FIG. 1C. As shown in FIGS. 1A to 1E, the description is given by taking an example in which at least one first module includes two first modules. That is, the description is given by taking an example in which the driving module includes two driving modules 1, two signal transmission modules 2, and two unidirectional gating modules 4. FIGS. 1A to 1E also show other elements in the array substrate, such as electrostatic discharge modules 6, each of which has a terminal connected to a start vertical input signal line, and the other terminal being grounded. FIGS. 1A to 1E schematically show elements in the present disclosure. FIGS. 1A to 1E also show other elements in the array substrate, which do not limit the present disclosure.

In some embodiments of the present disclosure, one first module may be disposed at one side of a non-display region of the display panel (e.g., at the left side of the non-display region of the display panel, as shown in FIGS. 1B and 1D). That is, one driving module 1 of the two driving modules 1, a corresponding signal transmission module 2 of the two signal transmission modules 2, and a corresponding unidirectional gating module 4 of the two unidirectional gating modules 4 may be disposed at the left side of the non-display region of the display panel.

In some embodiments of the present disclosure, the other first module may be disposed at other side of the non-display region of the display panel (e.g., the right side of the non-display region of the display panel, as shown in FIGS. 1C and 1E). That is, the other one of the two driving modules 1, the corresponding other one of the two signal transmission modules 2, and the corresponding other one of the two unidirectional gating modules 4 may be disposed at the right side of the non-display region of the display panel. However, the present disclosure is not limited thereto. The embodiments of the present disclosure are merely schematic illustrations of the arrangement positions of the two first modules. In other embodiments of the present disclosure, the two first modules may also be arranged in other ways.

The signal transmission module 2 arranged on one side of the display panel is electrically connected to the corresponding driving module 1 and is configured to transmit a driving signal to the corresponding driving module 1; the signal transmission module 2 disposed at one side of the display panel is connected in series with the corresponding unidirectional gating module 4, and the corresponding unidirectional gating module 4 is configured to be turned on when the voltage output by the signal transmission module 2 is greater than or equal to the turn-on voltage of the corresponding unidirectional gating module 4, and to be turned off when the voltage output by the signal transmission module 2 is less than the turn-on voltage of the corresponding unidirectional gating module 4, and the turn-on voltage of the unidirectional gating module 4 is greater than the turn-on voltage of the corresponding driving module 1.

The signal transmission module 2 arranged at the other side of the display panel is electrically connected to the corresponding driving module 1 and is configured to transmit a driving signal to the corresponding driving module 1; the unidirectional gating module 4 disposed at the other side of the display panel is connected in series with the corresponding signal transmission module 2, and is configured to be turned on when the voltage output by the signal transmission module 2 is greater than or equal to the turn-on voltage of the corresponding unidirectional gating module 4, and to be turned off when the voltage output by the signal transmission module 2 is less than the turn-on voltage of the corresponding unidirectional gating module 4, and the turn-on voltage of the unidirectional gating module 4 is greater than the turn-on voltage of the corresponding driving module 1.

As shown in FIG. 1A, the display panel further includes the electrostatic charge and discharge module 5, which is respectively connected in series with the unidirectional gating modules 4 disposed at both sides of the non-display region of the display panel and electrically connected to the grounding module 3. However, the arrangement of the electrostatic charge and discharge module 5, the grounding module 3, the plurality of driving modules 1, the plurality of signal transmission modules 2, and the plurality of unidirectional gating modules 4 in the display panel is not limited thereto.

In the embodiment of the present disclosure, the unidirectional gating module 4 may include a diode element, an input electrode of the diode element is electrically connected to an output terminal of the signal transmission module 2, and an output electrode of the diode element is electrically connected to an input terminal of the electrostatic charge and discharge module 5.

When the signal transmission module 2 outputs a voltage greater than or equal to a turn-on voltage of the diode element due to the accumulation of electrostatic charges, the diode element is turned on, and the electrostatic charges accumulated in the signal transmission module 2 may be led out to the diode element through the input electrode of the diode element electrically connected to the signal transmission module 2 and led out to the electrostatic charge and discharge module 5 through the output electrode of the diode element electrically connected to the electrostatic charge and discharge module 5, so that the electrostatic charges accumulated in the signal transmission module 2 is led out to the electrostatic charge and discharge module 5 through the unidirectional gating module 4.

Figure 2A:
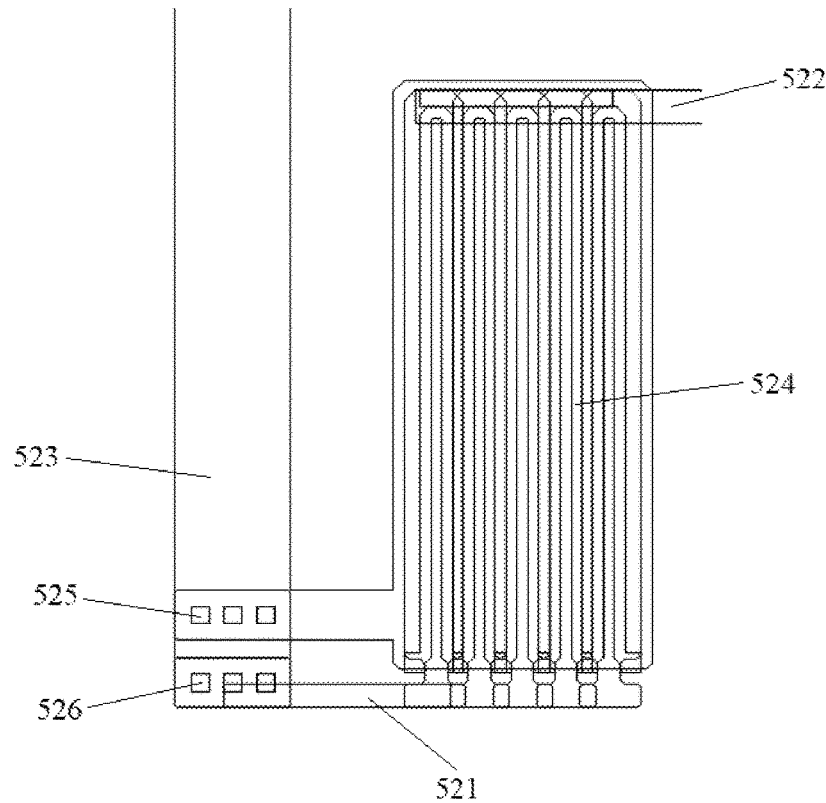
FIG. 2A is a schematic plan view of a structure of a unidirectional gating module provided in an embodiment of the present disclosure.
Figure 2B:
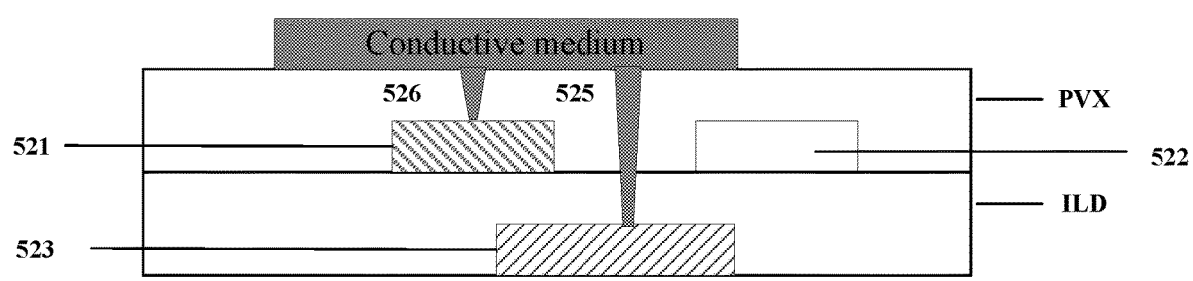
FIG. 2B is a schematic diagram of a structure of a unidirectional gating module provided in an embodiment of the present disclosure.

In the embodiment of the present disclosure, as shown in FIGS. 2A and 2B, the diode element 4 may include a thin film transistor; one of a source electrode 521 and a drain electrode 522 of the thin film transistor is used as an output electrode, and the other is electrically connected to a gate electrode 523 as an input electrode.

FIG. 2A is a schematic plan view of a structure of the unidirectional gating module. FIG. 2B is a schematic structural diagram of the unidirectional gating module. As shown in FIGS. 2A and 2B, the thin film transistor may include the source electrode 521, the drain electrode 522, the gate electrode 523, and a semiconductor layer 524. In some embodiments of the present disclosure, the source electrode 521, the drain electrode 522, and the gate electrode 523 may all be located on a same side of the semiconductor layer 524. However, the present disclosure is not limited thereto. In other embodiments of the present disclosure, the source electrode 521 and the drain electrode 522 may be positioned at opposite sides of the semiconductor layer 524 and spaced apart from each other, and the gate electrode 523 is positioned at the other side of the semiconductor layer 524. Alternatively, the source electrode 521 and the gate electrode 523 of the thin film transistor are electrically connected to each other as an input electrode, and the drain electrode 522 of the thin film transistor is used as an output electrode. However, the thin film transistor is not limited to such the form as a diode element. For example, the drain electrode 522 and the gate electrode 523 of the thin film transistor may be electrically connected to each other as an input electrode, and the source electrode 521 of the thin film transistor may be used as an output electrode.

As shown in FIGS. 2A and 2B, the source electrode 521 and the gate electrode 523 are located in different layers; the source electrode 521 and the drain electrode 522 are located in a same layer; the grounding module 3 (not shown) and the gate electrode 523 may be located in a same layer. An interlayer dielectric layer ILD is disposed between the gate electrode 523 and the source and drain electrodes 521 and 522, and a passivation layer PVX is disposed on a side of the source and drain electrodes 521 and 522 away from the gate electrode 523.

As shown in FIGS. 2A and 2B, the source electrode 521 and the gate electrode 523 are located in different layers, and thus, the source electrode 521 and the gate electrode 523 are electrically connected to each other by: forming a first through via (also referred to as transfer hole or through hole) 525 on the gate electrode 523, forming a second through via 526 on the source electrode 521, filling a conductive medium in the first through via 525 and the second through via 526, respectively, and connecting the conductive medium in the first through via 525 and the conductive medium in the second through via 526 through an additional conductive medium. In this way, the electrical connection between the source electrode 521 and the gate electrode 523 may be realized.

As shown in FIGS. 2A and 2B, the first through via 525 extends through the interlayer dielectric layer ILD and the passivation layer PVX; the second through via 526 extends through the passivation layer PVX; the source electrode 521 and gate electrode 523 are connected to each other through the conductive media in the first through via 525 and second through via 526.

Because a large number of thin film transistors need to be formed on the array substrate in the manufacturing process of the driving circuit, and the thin film transistors are used as the unidirectional gating modules 4 and are electrically connected to the signal transmission modules 2 and the electrostatic charge and discharge module 5, respectively, the unidirectional gating modules 4 may be simultaneously formed in the manufacturing process of the driving circuit, so that the manufacturing difficulty and the manufacturing cost of the driving circuit provided by the embodiment of the present disclosure are reduced.

Alternatively, the thin film transistor may include an amorphous silicon (a-Si) thin film transistor or an oxide thin film transistor.

Figure 3:
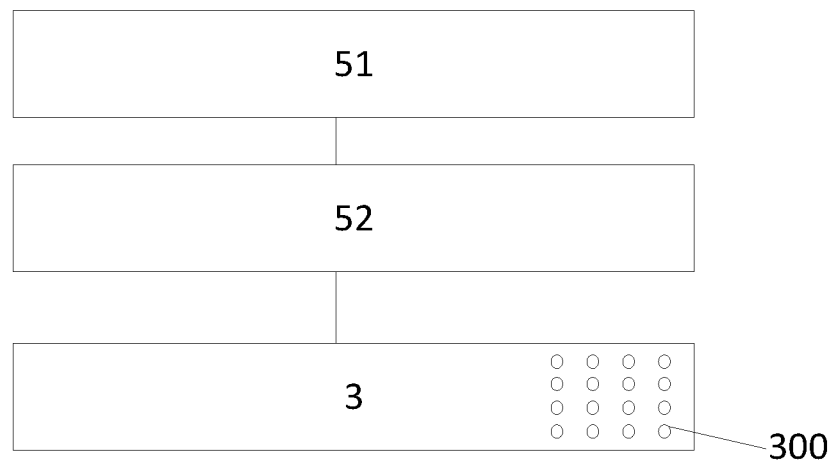
FIG. 3 illustrates a schematic diagram of a layout of an electrostatic charge and discharge module and a grounding module of a driving circuit provided in an embodiment of the present disclosure.

FIG. 3 illustrates a schematic diagram of a layout of an electrostatic charge and discharge module 5 and a grounding module 3 of a driving circuit provided in an embodiment of the present disclosure.

As shown in FIGS. 1A and 3, in the embodiment of the present disclosure, the electrostatic charge and discharge module 5 may include a capacitive element 51. A first electrode of the capacitive element 51 is electrically connected to the unidirectional gating modules 4, and a second electrode of the capacitive element 51 is electrically connected to the grounding module 3.

Due to the accumulation of electrostatic charges, the voltage of the signal transmission module 2 is greater than or equal to the turn-on voltage of the unidirectional gating module 4, such that the unidirectional gating module 4 is turned on. At this time, the electrostatic charges accumulated by the signal transmission module 2 may be led out to the first electrode of the capacitive element 51 electrically connected to the unidirectional gating module 4 through the unidirectional gating module 4, and the electrostatic charges are led out to the capacitive element 51 through the first electrode and are stored by the capacitive element 51; then, the capacitive element 51 leads the stored electrostatic charges to the grounding module 3 through the second electrode of the capacitive element 51 electrically connected to the grounding module 3. Thus, the capacitance element 51 stores the electrostatic charges led out from the signal transmission module 2 and discharges the stored electrostatic charges to the grounding module 3. When external electrostatic charges are introduced to the driving circuit through the grounding module 3, external electrostatic charges are introduced to the capacitive element 51 through the second electrode of the capacitive element 51 electrically connected to the grounding module 3 and are stored by the capacitive element 51; then, the capacitive element 51 leads the stored external electrostatic charges to the grounding module 3 through the second electrode of the capacitive element 51 electrically connected to the grounding module 3, so as to store the external electrostatic charges, and release the stored external electrostatic charges to the grounding module 3.

Figure 4:
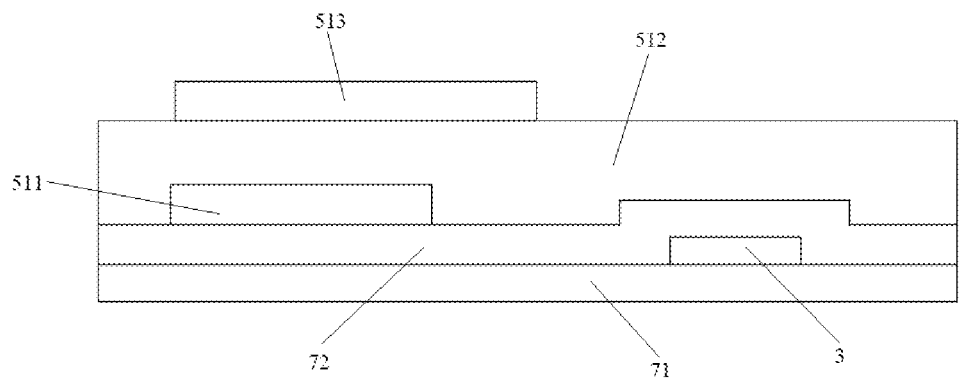
FIG. 4 shows a schematic diagram of a structure of a driving circuit provided in an embodiment of the present disclosure.
Figure 5:
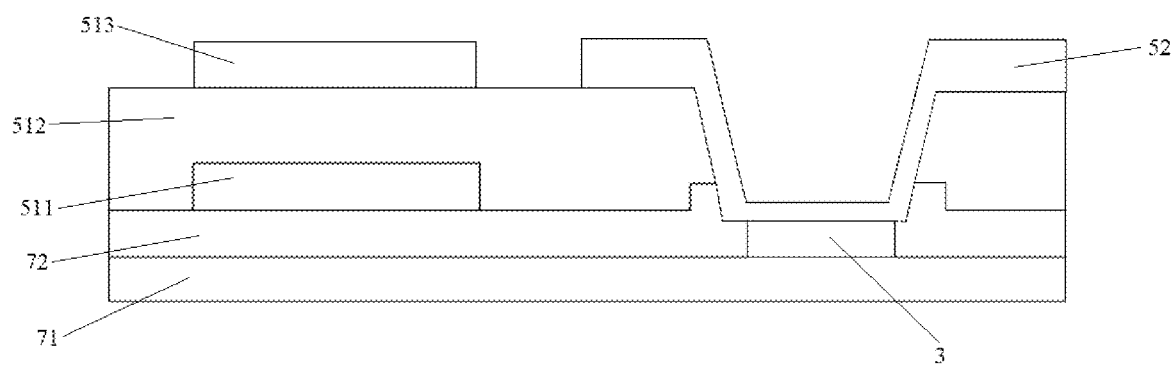
FIG. 5 shows a schematic diagram of a structure of a driving circuit provided in an embodiment of the present disclosure.

FIG. 4 shows a schematic diagram of a structure of a driving circuit provided in an embodiment of the present disclosure; FIG. 5 shows a schematic diagram of a structure of a driving circuit provided in an embodiment of the present disclosure. FIG. 4 is a cross-sectional view of the driving circuit taken along an A-A' line in FIG. 1D. FIG. 5 is a cross-sectional view of the driving circuit taken along a B-B' line shown in FIG. 1E. As shown in FIGS. 4 and 5, in the embodiment of the present disclosure, the capacitive element 51 may include a first conductive layer 511 (as one of the first electrode and the second electrode), an insulating layer 512, and a second conductive layer 513 (as the other of the first electrode and the second electrode). The insulating layer 512 is formed on the first conductive layer 511; the second conductive layer 513 is formed on the insulating layer 512. One of the first conductive layer 511 and the second conductive layer 513 serves as the first electrode, and the other serves as the second electrode. That is, the first conductive layer 511 may serve as the first electrode, and the second conductive layer 513 may serve as the second electrode. The second conductive layer 513 may serve as the first electrode, and the first conductive layer 511 may serve as the second electrode.

In the embodiment of the present disclosure, the first conductive layer 511 may be a source-drain metal film layer; the insulating layer 512 may be a silicon nitride film layer; and the second conductive layer 513 may be an indium tin oxide film layer. In the manufacturing process of the driving circuit, the source-drain metal film layer, the silicon nitride film layer and the indium tin oxide film layer are usually formed on the base substrate 71, are used as the first conductive layer 511, the insulating layer 512 and the second conductive layer 513 of the capacitive element 51, respectively, so that the electrostatic charge and discharge module 5 may be formed simultaneously with the driving circuit in the manufacturing process of the driving circuit, thereby reducing the manufacturing difficulty and the manufacturing cost of the driving circuit provided in the embodiment of the present disclosure.

As shown in FIG. 4, a gate insulating layer 72 may be formed on the base substrate 71 where the capacitive element 51 of the driving circuit is located. An electrode that may be used as the grounding module 3 is provided in the gate insulating layer 72; the source-drain metal film layer is formed on the gate insulating layer 72; the silicon nitride film layer is formed on the source-drain metal film layer; the indium tin oxide film layer is formed on the silicon nitride film layer; wherein the source-drain metal film layer may be used as the first conductive layer 511 of the capacitive element 51; the silicon nitride film layer may be used as the insulating layer 512 of the capacitive element 51; and the indium tin oxide film layer may be used as the second conductive layer 513 of the capacitive element 51.

As shown in FIGS. 1A and 3, in the embodiment of the present disclosure, the electrostatic charge and discharge module 5 may further include a resistive element 52. One terminal of the resistive element 52 is electrically connected to the capacitive element 51, and the other terminal is electrically connected to the grounding module 3; and the resistive element 52 is configured to transmit the charges discharged from the capacitive element 51 to the grounding module 3. As shown in FIG. 5, the other terminal of the resistive element 52 is electrically connected to the grounding module 3 through a via extending through the insulating layer 512 and the gate insulating layer 72.

When the electrostatic charge and discharge module 5 releases the stored charges, the charges are led out to the resistive element 52 through one terminal of the resistive element 52 electrically connected to the capacitive element 51; after flowing through the resistive element 52, the charges are led out to the grounding module 3 through the other terminal of the resistive element 52 electrically connected to the grounding module 3, and finally discharged through the grounding module 3. The charges stored in the capacitance element 51 may be slowly released by the resistive element 52 to the grounding module 3, thereby further preventing the charges of the normal driving signal from being led out to the electrostatic charge and discharge module 5 due to the too fast discharge of the electrostatic charges of the signal transmission module 2. Based on the above, the driving circuit may work normally.

In the disclosed embodiment, the resistive element 52 may include an indium tin oxide film layer. In the above design, in the manufacturing process of the driving circuit, the indium tin oxide film layer is formed on the base substrate 71; and the electrostatic charge and discharge module 5 and the driving circuit may be formed simultaneously by using the indium tin oxide film layer as the resistive element 52 in the manufacturing process of the driving circuit, so that the manufacturing difficulty and the manufacturing cost of the driving circuit provided in the embodiment of the present disclosure are reduced. The indium tin oxide film layer may be formed in a large horizontal space of the display panel, so that the resistive element 52 with a resistance value in a magnitude in a range of several Ohms to several giga Ohms may be realized.

In some embodiments of the present disclosure, a capacitance value of the capacitive element 51 should be as large as possible, so that charges may be better stored. In some embodiments of the present disclosure, the resistance value of the resistive element 52 should be as large as possible, so that a circuit structure may be better protected. In some embodiments of the present disclosure, value ranges of the capacitance value of the capacitive element 51 and the resistance value of the resistive element 52 are not specifically limited, and may be set according to actual needs. In some embodiments of the present disclosure, the capacitance value of the capacitive element 51 may be increased by increasing an effective plate area of the capacitive element 51 (an area of portions of the first conductive layer 511 (as one of the first electrode and the second electrode) and the second conductive layer 513 (as the other of the first electrode and the second electrode) of the capacitive element 51 directly facing to each other), increasing the dielectric constant of the insulating layer 512, or the like, or a combination thereof. In some embodiments of the present disclosure, the resistance value of the resistive element 52 may be increased by increasing a length of the resistive element 52 (as shown in FIGS. 1D and 1E), decreasing a cross-sectional area of the resistive element 52, or increasing a resistivity of the resistive element 52, or the like, or combinations thereof. As shown in FIG. 5, the gate insulating layer 72 may be formed on the base substrate 71 where the capacitive element 51 of the driving circuit is located. An electrode which may be used as the grounding module 3 is arranged in the gate insulating layer 72; the source-drain metal film layer is formed on the gate insulating layer 72; the silicon nitride film layer is formed on the source-drain metal film layer; and a via is provided in the silicon nitride film layer; the indium tin oxide film layers are formed on the silicon nitride film layer and in the via of the silicon nitride film layer; wherein the source-drain metal film layer may be used as the first conductive layer 511 of the capacitive element 51; the silicon nitride film layer may be used as the insulating layer 512 of the capacitive element 51; the indium tin oxide film layer formed on the silicon nitride film layer may be used as the second conductive layer 513 of the capacitive element 51; the indium tin oxide film layer formed in the via may serve as the resistive element 52; and the indium tin oxide film layer formed in the via of the silicon nitride film layer may be connected to an electrode in the gate insulating layer 72 which may be used as the grounding module 3, so that the other terminal of the resistive element 52 is electrically connected to the grounding module 3.

It should be understood that FIG. 3 is a plan view schematically showing only the capacitive element 51, the resistive element 52 and the grounding module 3. A plurality of vias 300 are provided on one side of the grounding module 3 (the right side as shown in FIGS. 1E and 3) through which the respective elements in the different layers are grounded. FIG. 4 is a schematic diagram showing a structure of a portion of a driving circuit where no via is provided; FIG. 5 is a schematic diagram showing a structure of a portion of a driving circuit where vias are provided. The capacitive element 51, the resistive element 52, and the grounding module 3 and the through-holes thereof schematically illustrated in FIG. 3 are not limited thereto. In other embodiments of the present disclosure, the capacitive element 51, the resistive element 52, the grounding module 3, and the vias thereof having other shapes or sizes or arranged positions and the like may be provided.

In the embodiment of the present disclosure, an aspect ratio (a width to length ratio) of the thin film transistor may be reduced by increasing, for example, a channel length of the thin film transistor, so that a turn-on voltage of the thin film transistor is increased. Therefore, for example, the channel length of the thin film transistor may be provided to be larger than a channel length of the first stage shift register, such that the aspect ratio of the thin film transistor may be smaller than that of the first stage shift register. In this way, the turn-on voltage of the thin film transistor is larger than that of the first stage shift register.

Figure 6:
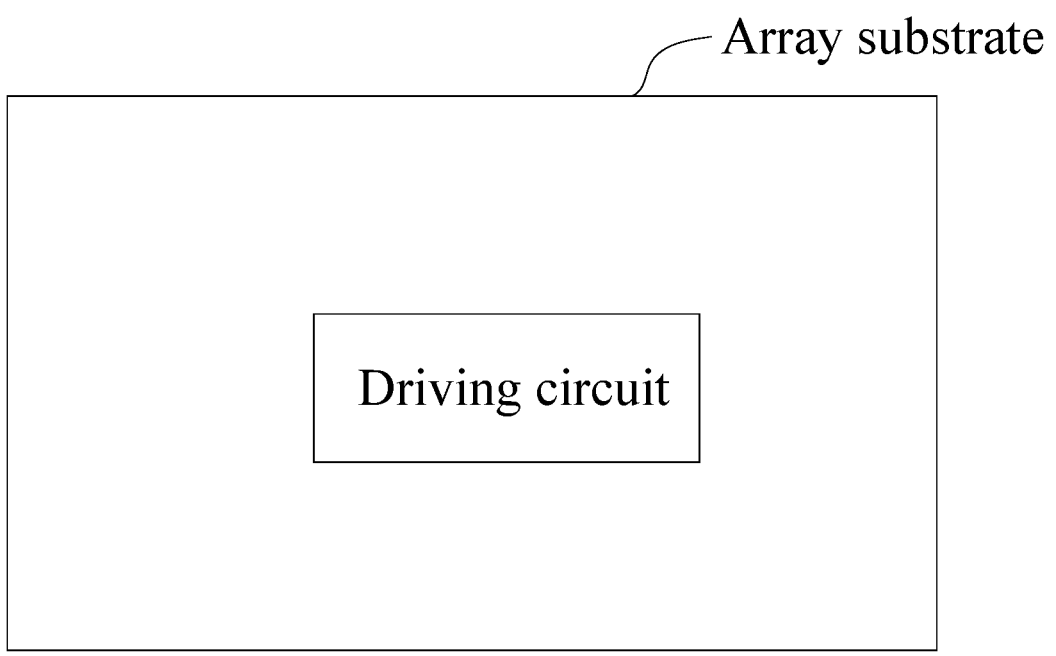
FIG. 6 illustrates a schematic diagram of an array substrate provided in an embodiment of the present disclosure.

FIG. 6 illustrates a schematic diagram of an array substrate in some embodiments according to the present disclosure. As shown in FIG. 6, in a second aspect, an embodiment of the present disclosure further provides an array substrate, which may include the driving circuit as provided in the embodiment of the present disclosure.

In the array substrate provided by the embodiment of the present disclosure, with the help of the driving circuit provided by the embodiment of the present disclosure, the driving circuit may be prevented from being broken down and burned out by electrostatic charges, the stability of the display panel is improved, and the frame width of the display panel may be reduced.

In the array substrate including the driving circuit provided in the embodiment of the present disclosure, the unidirectional gating module 4 and the signal transmission module 2 are connected with each other in series; the electrostatic charge and discharge module 5 is connected with and the unidirectional gating modules 4 in series and is grounded; the unidirectional gating module 4 may be turned on when the turn-on voltage of the unidirectional gating module 4 is less than or equal to the voltage of the signal transmission module 2; the electrostatic charge and discharge module 5 may store charges flowing through the electrostatic charge and discharge module 5, and release the stored charges to the grounding module 3. In this way, when the signal transmission module 2 has an output voltage greater than or equal to the turn-on voltage of the unidirectional gating module 4 due to electrostatic charges accumulated in the manufacturing process of the display panel, the unidirectional gating module 4 is turned on, so that the signal transmission module 2 is electrically connected with the electrostatic charge and discharge module 5 through the unidirectional gating module 4, and electrostatic charges accumulated by the signal transmission module 2 may be led out to the electrostatic charge and discharge module 5 through the unidirectional gating module 4, and the electrostatic charge and discharge module 5 stores and releases the electrostatic charges led out through the unidirectional gating module 4 to the grounding module 3, so that the electrostatic charges may be prevented from being introduced to the driving module 1 electrically connected to the signal transmission module 2, the driving circuit is prevented from being broken down and burned out by electrostatic charges, and the stability of the display panel is improved. In addition, when external electrostatic charges are introduced to the driving circuit through the grounding module 3 when the display panel is normally operated, with the help of the electrostatic charge and discharge module 5, the external electrostatic charges introduced may be stored and then released to the grounding module 3, thereby the grounding module 3 is not required to be covered by the sealant, the external electrostatic charges may be prevented from being introduced to the driving module 1, and the driving circuit is prevented from being broken down and burned out by electrostatic charges, the stability of the display panel is improved, and the frame width of the display panel may be reduced. In addition, in the array substrate provided in the embodiment of the present disclosure, the unidirectional gating module 4 may be turned off when the turn-on voltage of the unidirectional gating module 4 is greater than the voltage of the signal transmission module 2, and the turn-on voltage of the unidirectional gating module 4 is greater than the turn-on voltage of the driving module 1. In this way, when the signal transmission module 2 transmits a normal driving signal to the driving module 1, the unidirectional gating module 4 is in an off state, so that the normal driving signal may be transmitted to the driving module 1, and the driving circuit may work normally.

In a third aspect, an embodiment of the present disclosure further provides a display apparatus, which may include an array substrate and a color filter substrate that are aligned and assembled together, where the array substrate is the array substrate provided in the embodiment of the present disclosure.

In the display apparatus provided by the embodiment of the present disclosure, with the help of the array substrate provided by the embodiment of the present disclosure, the driving circuit may be prevented from being broken down and burned out by electrostatic charges, the stability of the display panel is improved, and the frame width of the display panel may be reduced.

In the display apparatus including the array substrate provided in the embodiment of the present disclosure, the unidirectional gating module 4 and the signal transmission module 2 are connected with each other in series; the electrostatic charge and discharge module 5 is connected with and the unidirectional gating modules 4 in series and is grounded; the unidirectional gating module 4 may be turned on when the turn-on voltage of the unidirectional gating module 4 is less than or equal to the voltage of the signal transmission module 2; the electrostatic charge and discharge module 5 may store charges flowing through the electrostatic charge and discharge module 5, and release the stored charges to the grounding module 3. In this way, when the signal transmission module 2 has an output voltage greater than or equal to the turn-on voltage of the unidirectional gating module 4 due to electrostatic charges accumulated in the manufacturing process of the display panel, the unidirectional gating module 4 is turned on, so that the signal transmission module 2 is electrically connected with the electrostatic charge and discharge module 5 through the unidirectional gating module 4, and electrostatic charges accumulated by the signal transmission module 2 may be led out to the electrostatic charge and discharge module 5 through the unidirectional gating module 4, and the electrostatic charge and discharge module 5 stores and releases the electrostatic charges led out through the unidirectional gating module 4 to the grounding module 3, so that the electrostatic charges may be prevented from being introduced to the driving module 1 electrically connected to the signal transmission module 2, the driving circuit is prevented from being broken down and burned out by electrostatic charges, and the stability of the display panel is improved. In addition, when external electrostatic charges are introduced to the driving circuit through the grounding module 3 when the display panel is normally operated, with the help of the electrostatic charge and discharge module 5, the external electrostatic charges introduced may be stored and then released to the grounding module 3, thereby the grounding module 3 is not required to be covered by the sealant, the external electrostatic charges may be prevented from being introduced to the driving module 1, and the driving circuit is prevented from being broken down and burned out by electrostatic charges, the stability of the display panel is improved, and the frame width of the display panel may be reduced. In addition, in the display apparatus provided in the embodiment of the present disclosure, the unidirectional gating module 4 may be turned off when the turn-on voltage of the unidirectional gating module 4 is greater than the voltage of the signal transmission module 2, and the turn-on voltage of the unidirectional gating module 4 is greater than the turn-on voltage of the driving module 1. In this way, when the signal transmission module 2 transmits a normal driving signal to the driving module 1, the unidirectional gating module 4 is in an off state, so that the normal driving signal may be transmitted to the driving module 1, and the driving circuit may work normally.

In conclusion, the driving circuit, the array substrate and the display apparatus provided by the embodiment of the present disclosure may prevent the driving circuit from being broken down and burned out by electrostatic charges, improve the stability of the display panel, and reduce the frame width of the display panel.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A driving circuit comprising at least one first module, an electrostatic charge and discharge module and a grounding module, wherein the at least one first module is electrically connected to the electrostatic charge and discharge module; each first module of the at least one first module comprises a driving module, a signal transmission module and a unidirectional gating module; the signal transmission module is electrically connected to the driving module and is configured to transmit a driving signal to the driving module; the grounding module is configured to be grounded; the unidirectional gating module is connected with the signal transmission module in series; the unidirectional gating module is configured to be turned on when a turn-on voltage of the unidirectional gating module is less than or equal to a voltage output by the signal transmission module, or turned off when the turn-on voltage of the unidirectional gating module is greater than the voltage output by the signal transmission module; and the turn-on voltage of the unidirectional gating module is greater than that of the driving module; and the electrostatic charge and discharge module is connected with the unidirectional gating module in each first module of the at least one first module in series and is electrically connected to the grounding module, and the electrostatic charge and discharge module is configured to store charges flowing through the electrostatic charge and discharge module and release the stored charges to the grounding module.

2. The driving circuit according to claim 1, wherein the unidirectional gating module comprises a diode element, an input electrode of the diode element is electrically connected to an output terminal of the corresponding signal transmission module, and an output electrode of the diode element is electrically connected to an input terminal of the electrostatic charge and discharge module.

3. The driving circuit according to claim 2, wherein the diode element comprises a thin film transistor, one of a source electrode and a drain electrode of the thin film transistor functions as the output electrode and the other of the source electrode and the drain electrode is electrically connected to a gate electrode and functions as the input electrode.

4. The driving circuit according to claim 3, wherein the thin film transistor comprises an amorphous silicon thin film transistor or an oxide thin film transistor.

5. The driving circuit according to claim 3, wherein the source electrode and the gate electrode are in different layers;
the source electrode and the drain electrode are in a same layer; and
the grounding module and the gate electrode are in a same layer.

6. The driving circuit according to claim 3, wherein the source electrode and the gate electrode are electrically connected to each other.

7. The driving circuit according to claim 1, wherein the electrostatic charge and discharge module comprises a capacitive element, a first electrode of the capacitive element is electrically connected to the unidirectional gating module, and a second electrode of the capacitive element is electrically connected to the grounding module.

8. The driving circuit according to claim 7, wherein the capacitive element comprises a first conductive layer, an insulating layer, and a second conductive layer, the insulating layer is on the first conductive layer, and the second conductive layer is on the insulating layer, and
one of the first conductive layer and the second conductive layer functions as the first electrode, and the other of the first conductive layer and the second conductive layer functions as the second electrode.

9. The driving circuit according to claim 8, wherein the first conductive layer is a source-drain metal film layer, the insulating layer is a silicon nitride film layer, and the second conductive layer is an indium tin oxide film layer.

10. The driving circuit according to claim 7, wherein the electrostatic charge and discharge module further comprises a resistive element;
one terminal of the resistive element is electrically connected to the capacitive element and the other terminal of the resistive element is electrically connected to the grounding module; and
the resistive element is configured to transmit charges released from the capacitive element to the grounding module.

11. The driving circuit according to claim 10, wherein the resistive element comprises an indium tin oxide film layer.

12. The driving circuit according to claim 1, wherein the at least one first module comprises a plurality of first modules; and
in each of the plurality of first modules, the signal transmission module is electrically connected to the corresponding driving module; the signal transmission module is configured to transmit a driving signal to the corresponding driving module; the unidirectional gating module is connected with the corresponding signal transmission module in series and connected with the electrostatic charge and discharge module in series, the unidirectional gating module is configured to be turned on when the turn-on voltage of the unidirectional gating module is less than or equal to the voltage output by the corresponding signal transmission module or turned off when the turn-on voltage of the unidirectional gating module is greater than the voltage output by the corresponding signal transmission module; and the turn-on voltage of the unidirectional gating module is greater than the turn-on voltage of the corresponding driving module.

13. The driving circuit according to claim 1, wherein the driving circuit comprises a gate driver on array circuit, which comprises a plurality of cascaded shift registers, the driving module comprises a first stage shift register of the plurality of cascaded shift registers, and the signal transmission module comprises a start vertical input signal line electrically connected to an input terminal of the first stage shift register and configured to transmit a start driving signal to the first stage shift register.

14. An array substrate, comprising a driving circuit, wherein
the driving circuit comprises at least one first module, an electrostatic charge and discharge module and a grounding module, wherein the at least one first module is electrically connected to the electrostatic charge and discharge module; each first module of the at least one first module comprises a driving module, a signal transmission module and a unidirectional gating module; the signal transmission module is electrically connected to the driving module and is configured to transmit a driving signal to the driving module; the grounding module is configured to be grounded; the unidirectional gating module is connected with the signal transmission module in series; the unidirectional gating module is configured to be turned on when a turn-on voltage of the unidirectional gating module is less than or equal to a voltage output by the signal transmission module, or turned off when the turn-on voltage of the unidirectional gating module is greater than the voltage output by the signal transmission module; and the turn-on voltage of the unidirectional gating module is greater than that of the driving module; and the electrostatic charge and discharge module is connected with the unidirectional gating module in each first module of the at least one first module in series and is electrically connected to the grounding module, and the electrostatic charge and discharge module is configured to store charges flowing through the electrostatic charge and discharge module and release the stored charges to the grounding module.

15. The array substrate according to claim 14, wherein the electrostatic charge and discharge module comprises a capacitive element, a first electrode of the capacitive element is electrically connected to the unidirectional gating module, and a second electrode of the capacitive element is electrically connected to the grounding module, the capacitive element comprises a first conductive layer, an insulating layer, and a second conductive layer, the insulating layer is on the first conductive layer, the second conductive layer is on the insulating layer, one of the first conductive layer and the second conductive layer functions as the first electrode, and the other of the first conductive layer and the second conductive layer functions as the second electrode, and the first conductive layer is a source-drain metal film layer, the insulating layer is a silicon nitride film layer, and the second conductive layer is an indium tin oxide film layer.

16. The array substrate according to claim 14, wherein the at least one first module comprises a plurality of first modules; and in each of the plurality of first modules, the signal transmission module is electrically connected to the corresponding driving module; the signal transmission module is configured to transmit a driving signal to the corresponding driving module; the unidirectional gating module is connected with the corresponding signal transmission module in series and connected with the electrostatic charge and discharge module in series, the unidirectional gating module is configured to be turned on when the turn-on voltage of the unidirectional gating module is less than or equal to the voltage output by the corresponding signal transmission module or turned off when the turn-on voltage of the unidirectional gating module is greater than the voltage output by the corresponding signal transmission module, and the turn-on voltage of the unidirectional gating module is greater than the turn-on voltage of the corresponding driving module.

17. The array substrate according to claim 14, wherein the driving circuit comprises a gate driver on array circuit, which comprises a plurality of cascaded shift registers, the driving module comprises a first stage shift register of the plurality of cascaded shift registers, and the signal transmission module comprises a start vertical input signal line electrically connected to an input terminal of the first stage shift register and configured to transmit a start driving signal to the first stage shift register.

18. A display apparatus, comprising an array substrate and a color filter substrate aligned and assembled together, wherein the array substrate is the array substrate according to claim 14.

19. The display apparatus according to claim 18, wherein the at least one first module comprises a plurality of first modules; and in each of the plurality of first modules, the signal transmission module is electrically connected to the corresponding driving module; the signal transmission module is configured to transmit a driving signal to the corresponding driving module; the unidirectional gating module is connected with the corresponding signal transmission module in series and connected with the electrostatic charge and discharge module in series, the unidirectional gating module is configured to be turned on when the turn-on voltage of the unidirectional gating module is less than or equal to the voltage output by the corresponding signal transmission module or turned off when the turn-on voltage of the unidirectional gating module is greater than the voltage output by the corresponding signal transmission module; and the turn-on voltage of the unidirectional gating module is greater than the turn-on voltage of the corresponding driving module.

20. The display apparatus according to claim 18, wherein the driving circuit comprises a gate driver on array circuit, which comprises a plurality of cascaded shift registers, the driving module comprises a first stage shift register of the plurality of cascaded shift registers, and the signal transmission module comprises a start vertical input signal line electrically connected to an input terminal of the first stage shift register and configured to transmit a start driving signal to the first stage shift register.

* * * * *